United States Patent [19]
Scaman et al.

[11] Patent Number: 5,821,759
[45] Date of Patent: Oct. 13, 1998

[54] METHOD AND APPARATUS FOR DETECTING SHORTS IN A MULTI-LAYER ELECTRONIC PACKAGE

[75] Inventors: Michael E. Scaman, Peekskill; Edward J. Yarmchuk, Mahopac; Yuet-Ying Yu, Hopewell Junction, all of N.Y.

[73] Assignee: International Business Machines Corporation, Armonk, N.Y.

[21] Appl. No.: 807,076

[22] Filed: Feb. 27, 1997

[51] Int. Cl.⁶ .................................................. G01R 31/28
[52] U.S. Cl. ........................ 324/529; 324/537; 324/754; 438/17
[58] Field of Search ..................... 324/522, 527, 324/529, 537, 538, 750, 765, 158.1, 95, 754; 438/14, 17

[56] References Cited

U.S. PATENT DOCUMENTS

| | | | |
|---|---|---|---|
| 454,233 | 9/1891 | Koontz | 324/529 |
| 1,158,086 | 10/1915 | Vahey | 324/529 |
| 2,226,021 | 12/1940 | Schweitzer, Jr. | 324/547 |
| 2,249,166 | 7/1941 | Parker et al. | 324/529 |
| 2,698,921 | 1/1955 | Wharton | 324/529 |
| 2,769,868 | 11/1956 | Brownlow | 324/529 |
| 2,974,274 | 3/1961 | Lindberg, Jr. et al. | 324/379 |
| 3,753,089 | 8/1973 | Gunn et al. | 324/529 |
| 3,882,287 | 5/1975 | Simmonds | 324/66 |
| 3,992,663 | 11/1976 | Seddick | 324/537 |
| 4,186,338 | 1/1980 | Fichtenbaum | 324/521 |
| 4,829,238 | 5/1989 | Goulette et al. | 324/750 |
| 5,006,788 | 4/1991 | Goulette et al. | 324/750 |
| 5,073,754 | 12/1991 | Henley | 324/529 |
| 5,218,294 | 6/1993 | Soiferman | 324/158.1 |
| 5,406,209 | 4/1995 | Johnson et al. | 324/750 |
| 5,424,633 | 6/1995 | Soiferman | 324/538 |
| 5,486,753 | 1/1996 | Khazam et al. | 324/537 |
| 5,517,110 | 5/1996 | Soiferman | 324/538 |
| 5,578,930 | 11/1996 | Sheen | 324/529 |
| 5,714,888 | 2/1998 | Naujoks | 324/750 |

OTHER PUBLICATIONS

IBM Technical Disclosure Bulletin, "Electro–Optic Sampling for Multi–Layer Ceramic Test," vol. 38, No. 05, May 1995, pp. 177–179.

Primary Examiner—Diep N. Do
Attorney, Agent, or Firm—Whitham, Curtis & Whitham; H. Daniel Schnurmann

[57] ABSTRACT

A method and apparatus for locating shorts in multi-layer electronic packages during manufacture allows repair of the shorts and improved yields of the packages. A multi-layer package is fitted in a fixture after forming a thin film layer of metalization, and test is performed to detect shorts in the package. If a short is detected, a low current, high frequency signal is injected in pins on a bottom surface of the package. An approximate two dimensional location of the short is sensed by detecting an electromagnetic force induced by a magnetic field inductively coupled to a sensor proximate to the short on a top surface of the multi-layer package. The approximate location of the short is then inspected to precisely locate the short.

31 Claims, 7 Drawing Sheets

METHOD AND APPARATUS FOR DETECTING SHORTS IN A MULTI-LAYER ELECTRONIC PACKAGE

BACKGROUND OF THE INVENTION

Field of the Invention

The present invention generally relates to testing electronic circuits and, more particularly, to a method and apparatus for testing for shorts in voltage planes in multi-layer electronic packages, such as multi-layer ceramic modules (MCMs), silicon on ceramic modules (SCMS) and printed circuit boards (PCBs), during the manufacturing process to permit repair and thereby improve yield.

Background Description

In the manufacture of MCM, SCM and PCB packaging, there is a generic problem of how to locate voltage to voltage plane shorts. In principle, such shorts are easily detected using Ohm meter testing between voltage to ground or voltage plane to voltage plane; however, in practice, there may be tens of thousands of places a short could occur and, if not located, the product is generally scrapped. For many complex products, this may be on the order of 5% yield loss. Just as a short between voltage planes is a fatal defect, an input/output (I/O) short to another network will cause a fatal defect.

In order to improve yield, it is desirable to detect shorts in the packaging during the manufacturing process. That is, as each layer of a multi-layer package is added, the package can be tested to determine if there are any shorts and, if so, a repair can be made before the package is processed further.

SUMMARY OF THE INVENTION

It is therefore an object of the present invention to provide a method and apparatus for testing for shorts between voltage planes and between I/O pins of a multi-layer electronic package during the manufacture of the package.

According to the invention, there is provided a test fixture constructed for each multi-layer electronic package. The test fixture could be a simple pogo plate contacting a few pads of each type on the bottom surface metalurgy (BSM) plane or a more elaborate fixture which allows contact with each BSM pad. This test fixture is used to first detect I/O shorts by contacting and isolating each voltage and ground. At each thin film mesh layer, an I/O short will be to a voltage plane, so a new I/O thin film short would be detected by putting the package in the fixture and testing the combined signal test point to the mesh plane.

If a short is detected, the test fixture allows contact of at least two BSM I/O pins of the voltage planes which were shorted to each other. A low current, high frequency signal (on the order of 5 mA to 100 mA and 20 kHz to 100 kHz) is injected into the voltage plane short via the BSM I/O pins. This produces an oscillating high frequency magnetic field in the vicinity of the thin film short. The magnetic field mapped by a sensor such as a Hall-effect probe or pickup coil. The preferred implementation is to use a pickup coil comprising a small ferrite core inductor held close to the top surface metalurgy (TSM) of the package where the short is most likely to be. The magnetic field will inductively couple to the coil. The induced electromagnetic force (EMF) in the coil will be 90° out of phase with the input current and can be correlated using a lock in amplifier. The output of the lock in amplifier may go to an analog to digital (A/D) converter to provide an input to a computer which controls the scanning and mapping the output. In the alternative, the output of the lock in amplifier can go directly to a voltage controlled oscillator (VCO) driving a speaker if the part is scanned manually.

The pickup coil is placed in parallel and a fixed distance from a microscope objective lens or the electronics could be built into the microscope to more easily view the defect once approximately located. The pickup coil could be an individual hollow iron core coil surrounding the objective lens or could be an array of an even number of differentially wound coils. Additionally, this could be used as a diagnostic tool in locating buried shorts and also BSM signal to BSM signal shorts or BSM signal to voltage shorts.

Since the BSM points where the test current is inserted will cause a magnetic field that may penetrate the substrate, the voltage for some should have two sets of voltage pads separated by a significant distance. One may either manually switch which set is used and rule out or confirm a short over the entry point or simultaneously test using two frequencies and two lock in circuits.

Using the techniques of the invention during typical multi-layer, thin film manufacture, voltage shorts will be detected while repairable and still on the top surface. The result is an improved yield in complex, multi-layer electronic packages.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
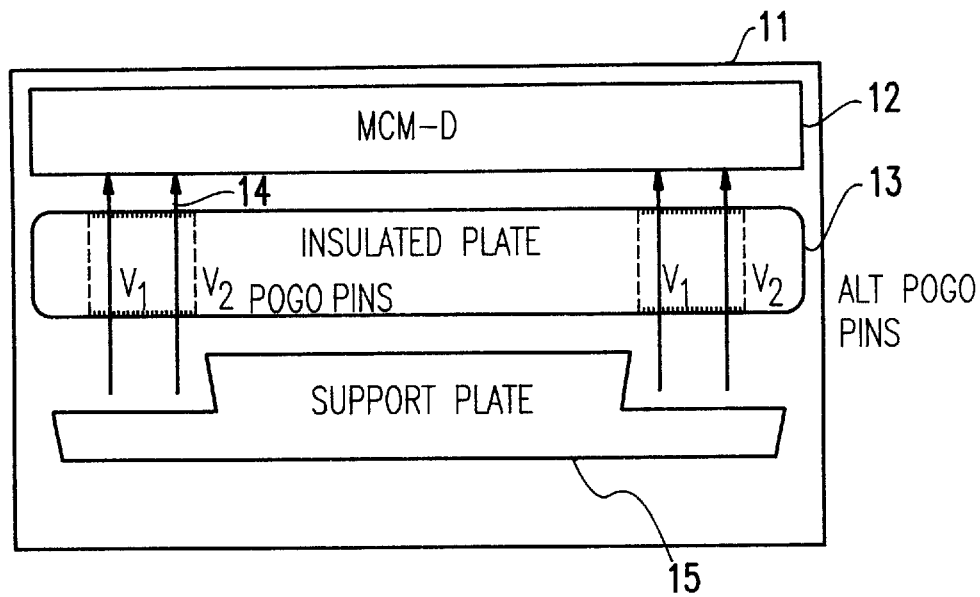
FIG. 1 is a functional block diagram showing a simple voltage plane only fixture according to the invention.

Referring now to the drawings, and more particularly to FIG. 1, there is shown in functional block diagram form the test fixture according to the invention to illustrate the principle of operation for detecting I/O shorts. The test fixture 11 receives the multi-layer package 12 to be tested and presses the bottom surface of the package against a "pogo" plate 13. The pogo plate contains multiple, resiliently mounted pins 14 which contact all or almost all BSM I/O pads. The pogo plate 13 is supported with a support plate 15.

An ohmmeter may be used in conjunction with this fixture for detection of voltage plane to voltage plane shorts. This may be used for testing for voltage to voltage shorts, pickup coil location of the shorts, thermal imaging or high voltage or current pulse blowing the shorts where the shorts are voltage plane to voltage plane. The weight of a large substrate will be sufficient to contact BSM voltage pads to corresponding pins on the pogo plate 13. For very small and light weight substrates, additional spring or pneumatic force may be added to accomplish this.

Figure 2:
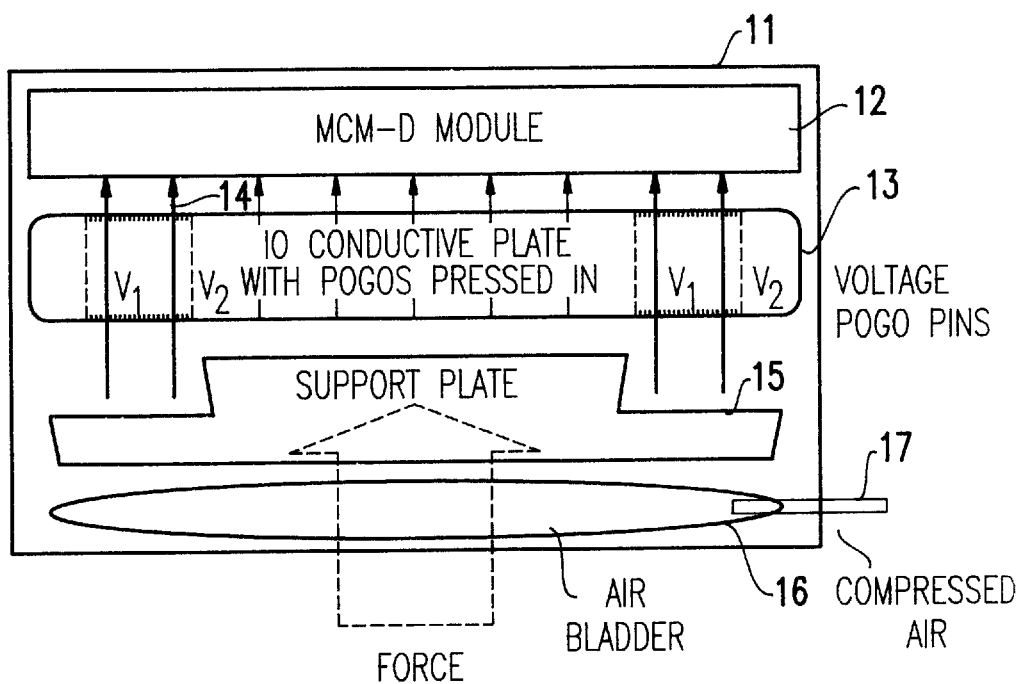
FIG. 2 is a functional block diagram showing an enhanced voltage plane and I/O fixture according to the invention.

FIG. 2 shows an enhanced voltage plane fixture that can be used not only to detect and locate voltage to voltage shorts, but also voltage plane to any BSM I/O short. This fixture includes an air bladder 16 under the support plate 15. The bladder 16 communicates by a nipple 17 with a source of compressed air (not shown). to produce a force that presses the voltage pogo pins 14 against the BSM of the module 12. As in the fixture shown in FIG. 1, an ohmmeter can be used in conjunction with the fixture to detect voltage to voltage plane or voltage plane to BSM I/O shorts. A large substrate may have thousands of I/O pins and 10 to 15 pounds of pneumatic pressure may be required to provide sufficient contact pressure for all the pins.

Figure 3:
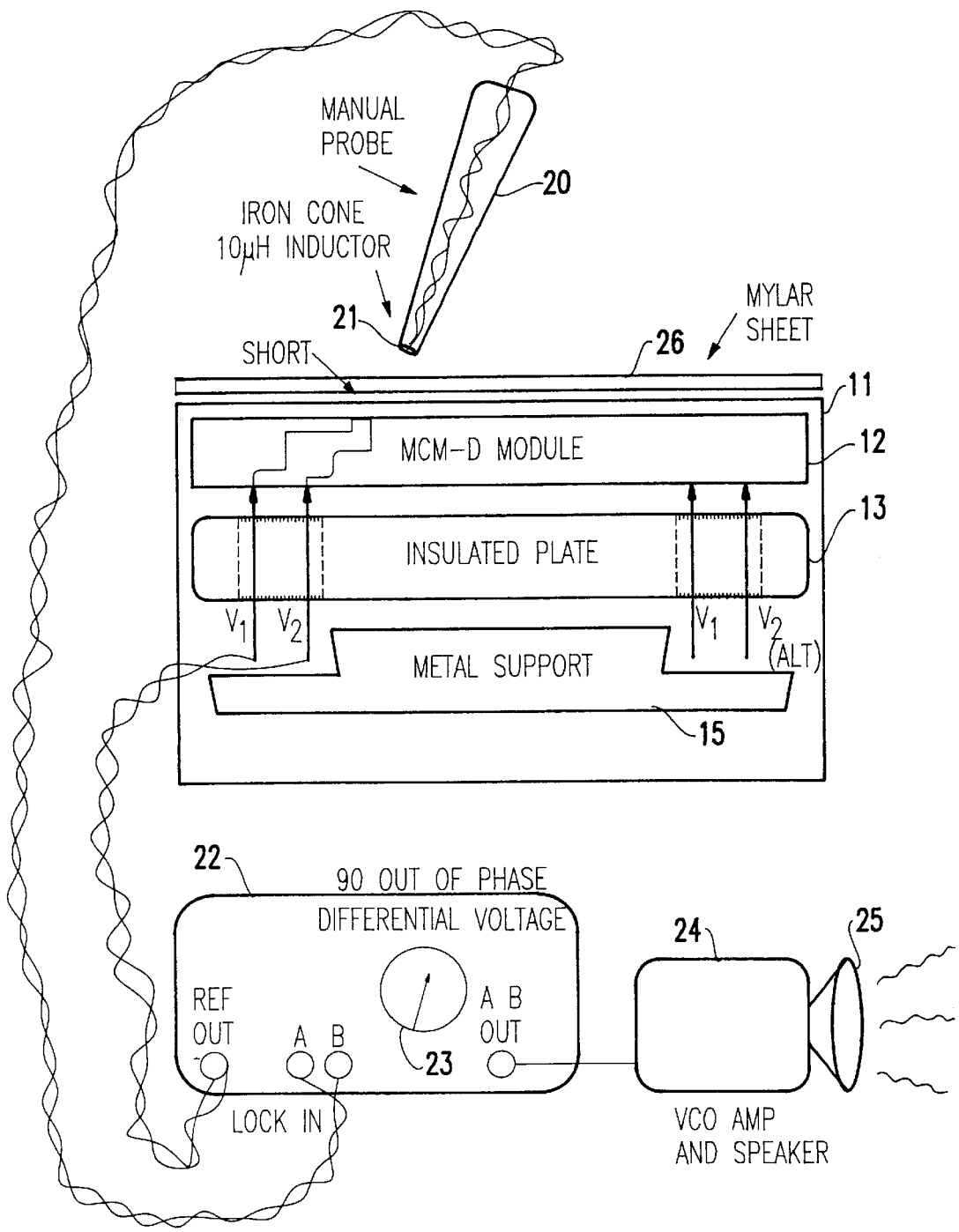
FIG. 3 is a functional block diagram showing the voltage plane fixture of FIG. 1 with a manual pickup coil probe with lockin and speaker.

FIG. 3 shows how a manual probe 20 with a micro Henry ($\mu$H) iron core inductor at the tip 21 can be used in conjunction with a lock in circuit 22 to approximate the location of a short. The lock in circuit 22 provides a high frequency signal output to pins on the pogo plate 13. The output of probe 20 is input to the lock in circuit 22 which looks for the back EMF induced 90° out of phase signal in the probe and displays it, for example on a meter 23. The output to the meter can also be supplied to a voltage controlled oscillator (VCO) 24 which feeds an amplifier and a speaker 25 to assist in manual use of the probe 20. A clean thin Mylar sheet 26 covers the top surface of the module 12, and the operator can mark the approximate location of the short and carry the module 12 and the sheet 26 to a manual microscope to pin point the location for repair.

Figure 4:
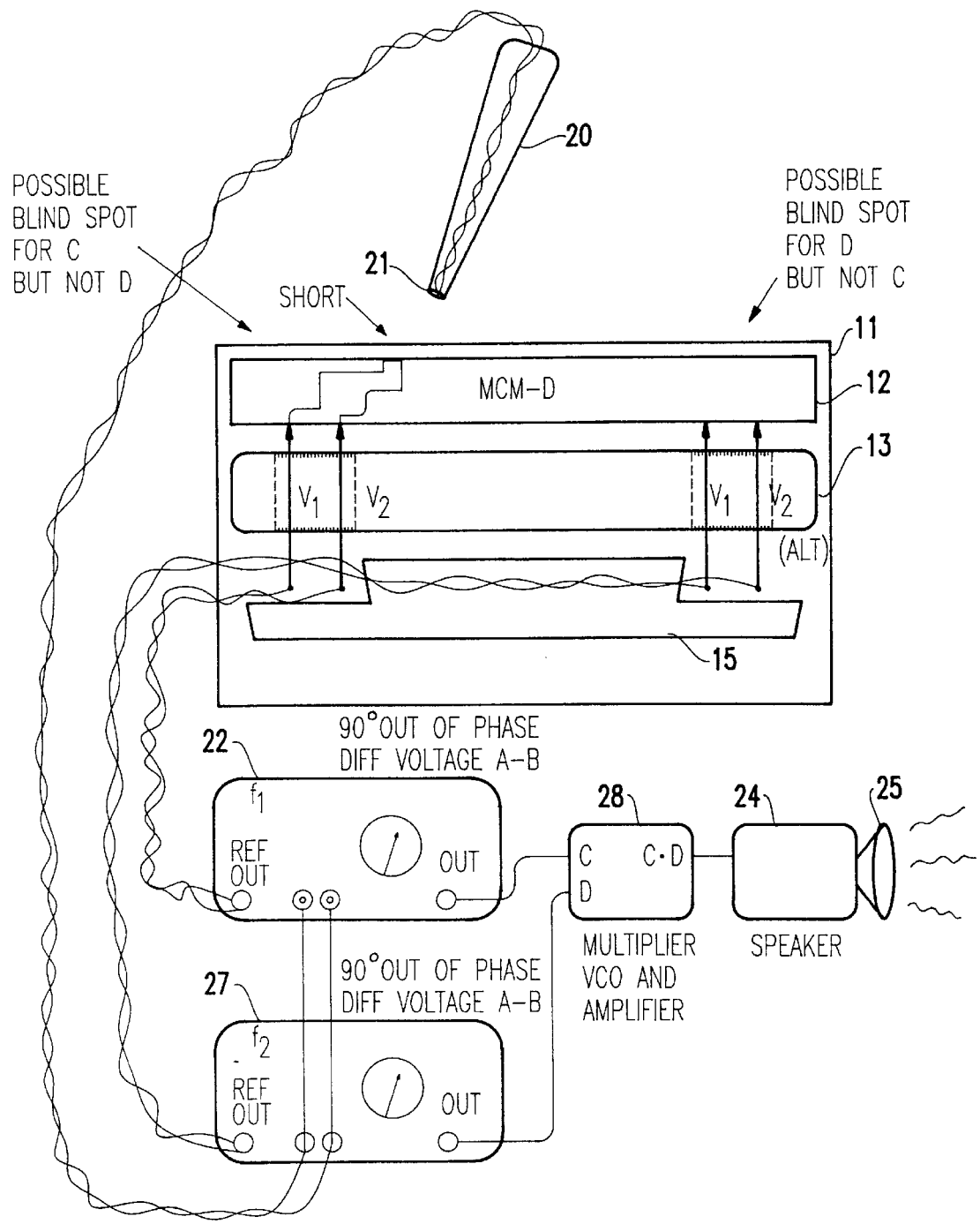
FIG. 4 is a functional block diagram showing the arrangement of FIG. 3 which employs two current entry points, two frequencies and two lockins to avoid blind spots.

FIG. 4 shows the use of two current entry points. One is supplied by lock in circuit 22 at a first frequency $f_1$ and the other is supplied by a second lock in circuit 27 at a second frequency $f_2$. The meter outputs of the lock in circuits 22 and 27 are supplied to a multiplier 28. Since the signal induced by the BSM current entry points for the voltage planes may cause fields that may penetrate a thin substrate, there could be an area around the entry point that causes a blind spot as far as locating shorts is concerned. The arrangement shown in FIG. 4 minimizes this by the use of two alternative BSM voltage entry points. By using the two different frequencies as illustrated, the two reference signals can be applied simultaneously. In either case, the short will be where both lock in circuits detect it.

Figure 5:
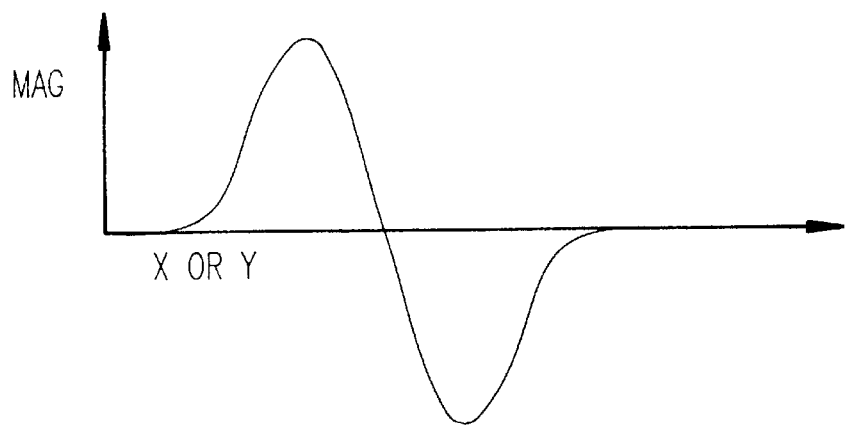
FIG. 5 is a graph showing the single coil probe response switching due to the magnetic field reversal on each side of the current path.
Figure 6:
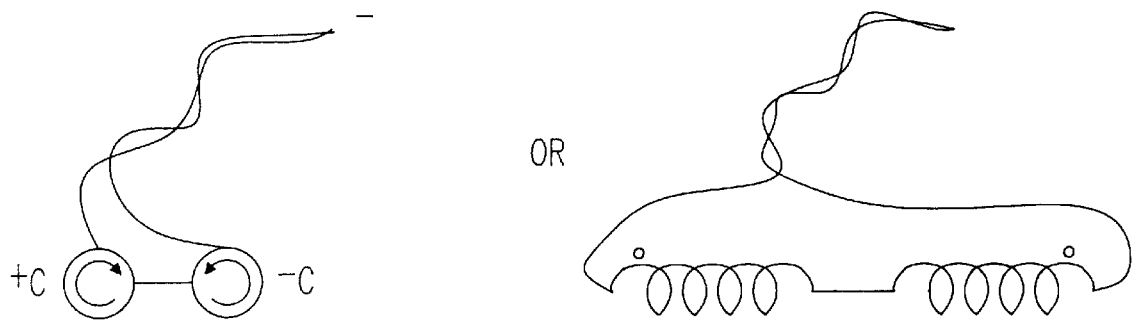
FIG. 6 is a pictorial illustration of a differentially wound probe tip.
Figure 7:
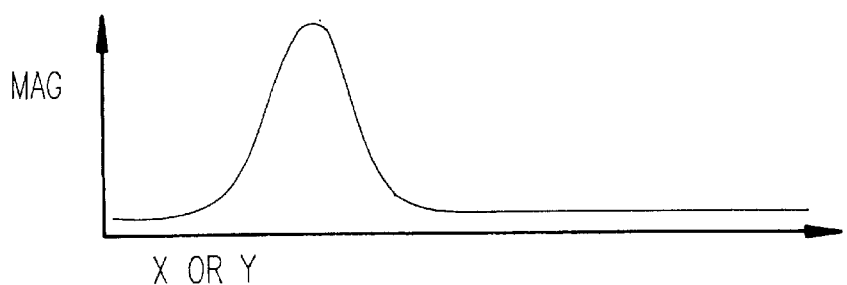
FIG. 7 is a graph of the response of a differentially wound probe tip.

A representative probe response for either of the embodiments shown in FIGS. 3 and 4 is shown in FIG. 5. The output signal switches in polarity due to the magnetic field reversal on either side of the current path. By using a differentially wound probe tip as represented in FIG. 6, a response as generally illustrated in FIG. 7 can be obtained. This response has a peak which is similar to a correlation peak and, when detected, reduces the area of the thin film that needs to be visually scanned with the microscope to precisely locate the short.

Figure 8:
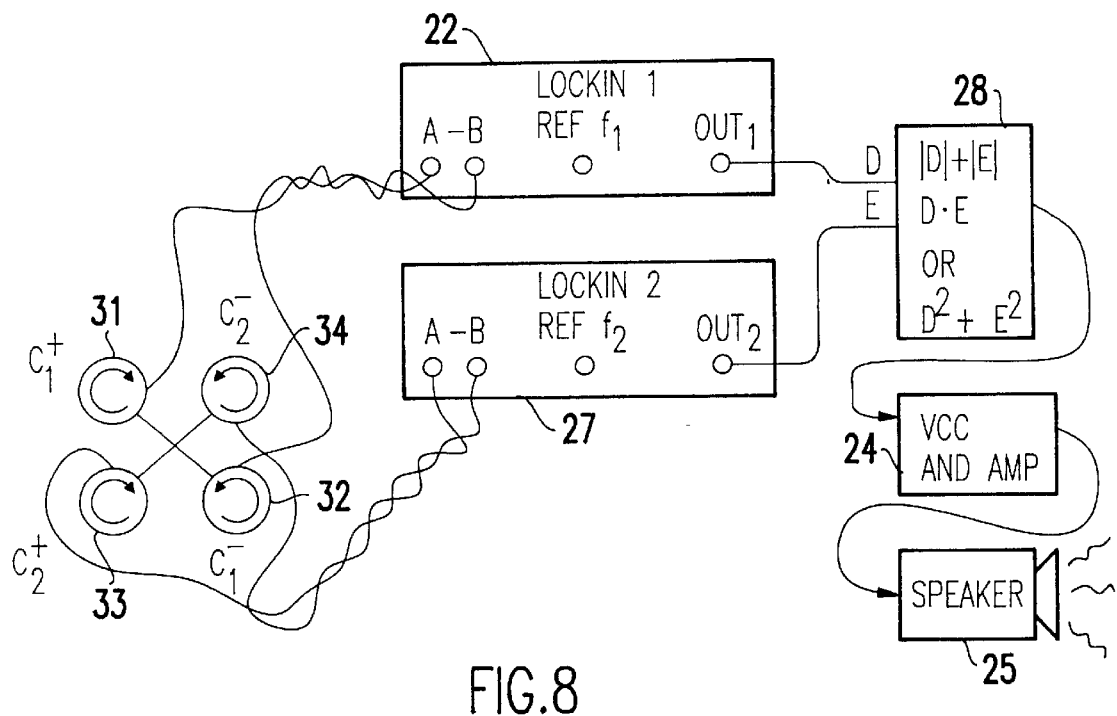
FIG. 8 is a functional block diagram showing two ganged differentially wound probe tips for use in manual test procedure.
Figure 9:
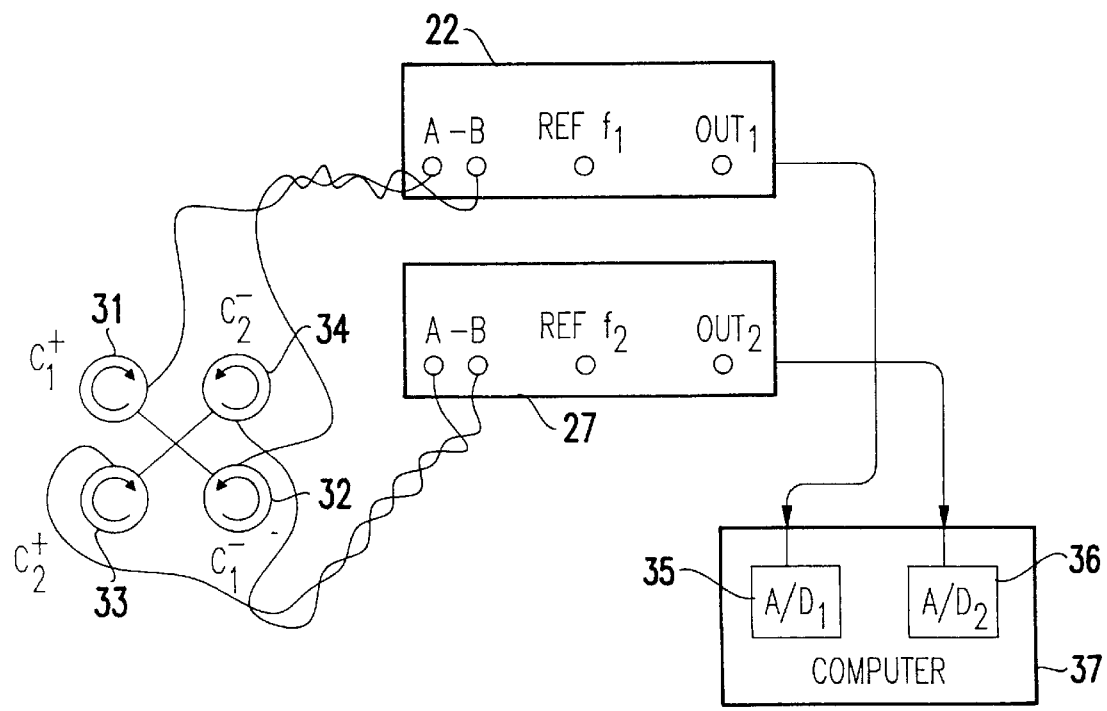
FIG. 9 is functional block diagram showing two ganged differentially wound probe tips for use in a computer controlled test procedure.

FIG. 8 shows a pair of differential coils 31, 32 and 33, 34 used in a probe and supplying the lock in circuits 22 and 27. This arrangement can be used for direction invariance and also to avoid blind spots for manual use. The same basic arrangement as shown in FIG. 8 can be used in a computer controlled system as shown in FIG. 9. In this case the outputs of the lock in circuits 22 and 27 are input to analog to digital (A/D) circuits 35 and 36, respectively, of instrument inputs of a computer 37.

Figure 10:
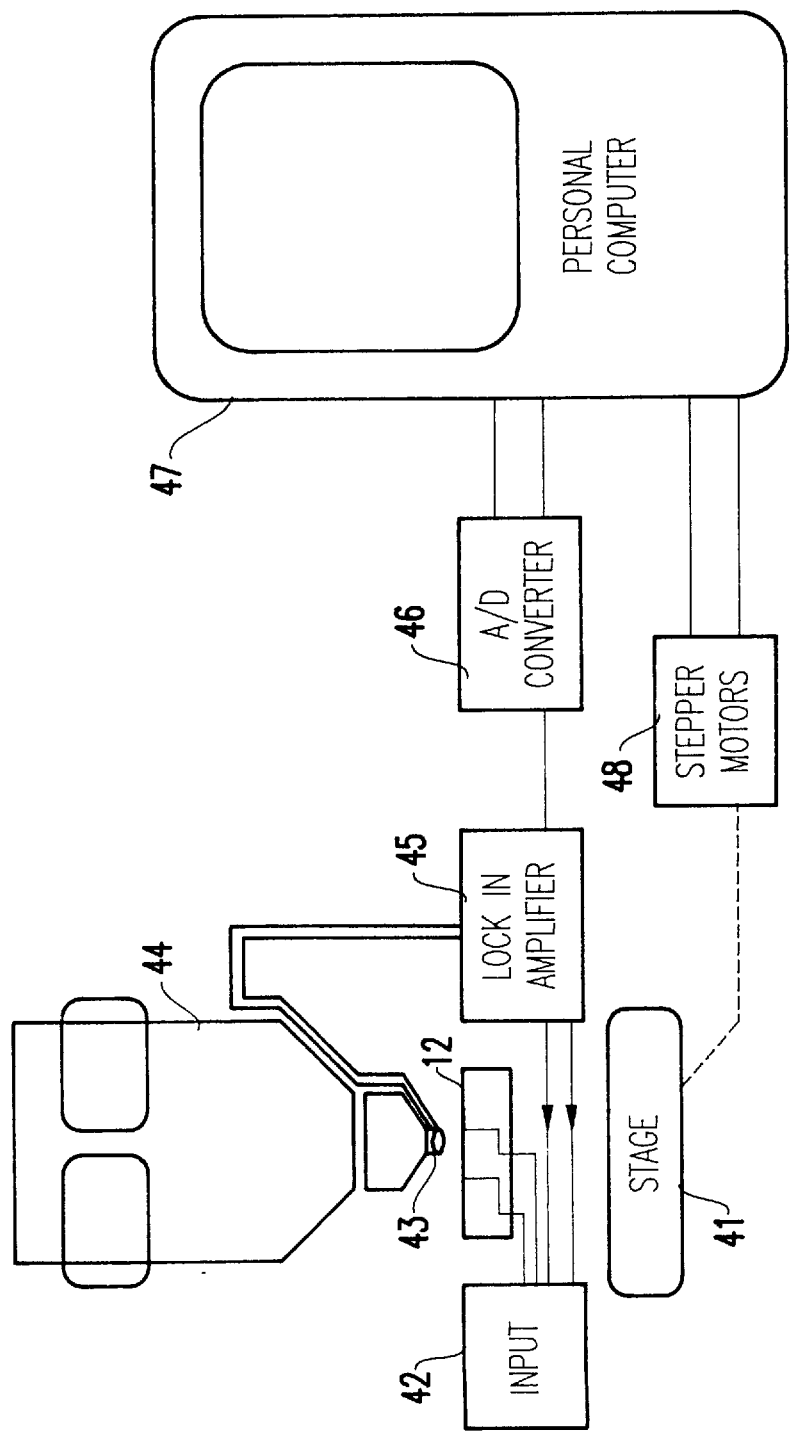
FIG. 10 is a more detailed block diagram showing a computer controlled configuration with a pickup coil built into a microscope objective.

FIG. 10 shows in more detail the test apparatus according to the invention. A multi-layer package 12 is held in a fixture mounted on a movable stage 41. The stage is moveable in X and Y coordinates. Movement of the stage may be manual or by servo mechanism. An input current from source 42 of approximately 5 mA to 100 mA at 20 kHz to 100 kHz is applied to BSM I/O pins of the multi-layer package. A 10 $\mu$H ferrite core inductor 43 surrounding the objective of a microscope 44 is positioned in close proximity to the top surface of the multi-layer package 12. The induced voltage due to a short is 90° out of phase with current applied to the BSM I/O pins. A lock in circuit 45 receives inputs from both the ferrite core inductor 43 and the input current source 42. As the stage 41 is moved in the X,Y plane, the response of the amplifier 45 is similar to that of a correlation function (see FIG. 7) as the location of the short comes in proximity of the ferrite core inductor 43. The output of the amplifier 45 is input to an A/D converter 46 which provides a digitized output to a computer 47, such as a personal computer. The computer 47 is programmed as part of a servo mechanism loop to control the movement of the stage 41 to maximize the output of the lock in circuit 45. The output of the computer 47 is supplied to stepper motors 48 used to move the stage 41 in the X,Y plane.

Figure 11:
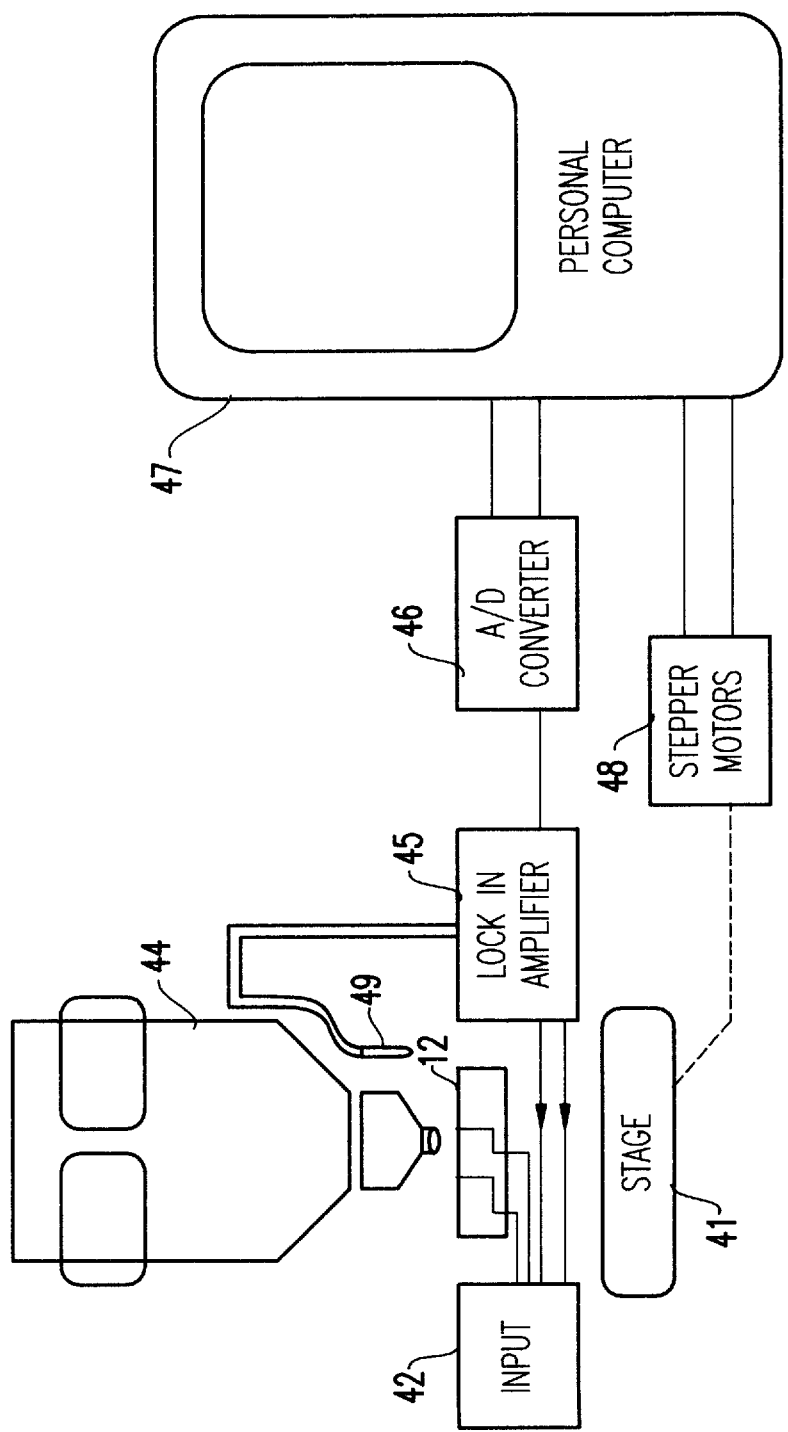
FIG. 11 is a more detailed block diagram showing a computer controlled configuration with a pickup coil probe a fixed distance from the objective lens to accommodate rotating objectives.

In the embodiment of FIG. 10, there would be a quick disconnect of a twisted pair to the objective of the microscope to allow free manual rotation of the objective lenses of the microscope, if desired. In FIG. 11, the arrangement of FIG. 10 has been modified to provide the pickup coil 49 a fixed distance from the objective to avoid interfering with rotating objective lenses.

If is desired to locate shorts inside the module 12 rather than on the top surface metalurgy (TSM), the stage 41 can be an X,Y,Z stage. The operation would be similar to that described above. Once a short is located in the X,Y directions, the response is profiled in the Z direction to determine an approximate depth of the short in the module.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method for locating shorts in multi-layer electronic packages during manufacture, comprising steps of:

fitting a multi-layer package in a fixture, after forming a thin film layer of metalization on a top surface of the package;

detecting a short in the top surface of the package;

injecting a first test signal into a set of pins on a bottom surface of the package;

detecting a magnetic field produced by a short on the top surface when said first test signal is applied to said set of pins, the short being at least one of a short between planes of the package and an I/O-to-plane short of the package;

determining an approximate two-dimensional location of the short on the top surface based on a location of said magnetic field as detected in said detecting step; and inspecting the top surface at the approximate location of the short to determine a location of the short within said approximate location.

2. The method recited in claim 1 wherein the step of detecting said magnetic field comprises steps of moving an iron core inductor across the top surface of the multi-layer package, and detecting induced in the iron core inductor by said magnetic field, and wherein said method further comprises a step of providing an output signal indicative of the approximate location of the short.

3. The method recited in claim 2 wherein the step of providing an output signal comprises the steps of:

generating a visual indication of detected signal strength; and generating an audible indication of the detected signal strength.

4. The method recited in claim 2 further comprising steps of:

injecting a second test signal in said set of pins on the bottom surface of the package, said second test signal having a different frequency from the first test signal;

detecting a second high frequency signal induced in the iron core inductor by the second test signal; and detecting the approximate location of the short based on the first and second high frequency signals.

5. The method recited in claim 4 wherein the first and second signals are injected in a sequential order.

6. The method recited in claim 4 wherein the first and second signals are injected simultaneously, and wherein, before the step of detecting the approximate location of the short based on the first and second high frequencys signal, a step of combining the first and second high frequency signals is performed by multiplying the first and second high frequency signals.

7. The method recited in claim 4, wherein said second test signal is a low current, high frequency signal.

8. The method recited in claim 4, wherein said first test signal is injected into an entry point on the bottom surface of the package different from an entry point into which said second test signal is injected.

9. The method recited in claim 2 wherein the step of moving the iron core inductor across the top surface of the multi-layer package is performed by a stage which supports the fixture, said method further comprising the steps of:

converting the output signal to a digital signal; and controlling movement of said stage with a computer to maximize the output signal, the computer providing the output signal indicative of the approximate location of the short.

10. The method recited in claim 9, wherein the iron core inductor is mounted in relation to a microscope having an objective lens proximate to the top surface of the multi-layer package, said microscope being used to determine the location of the short within said approximate location.

11. The method recited in claim 9 wherein said stage is moveable in three perpendicular axes, the stage being controlled by the computer to maximize the detected output in a plane parallel to the top surface and then moved in a perpendicular direction to said plane to provide an indication of a depth of the short within said multi-layer package.

12. The method recited in claim 9, wherein said computer maximizes said output signal by moving said stage to a position, relative to the top surface, where said magnetic field is detected to be maximum.

13. The method recited in claim 1, wherein said detecting step includes moving a probe over said top surface to detect said magnetic field, said probe detecting said magnetic field as a back electromotive force induced in a coil of the probe which is 90° out of phase with said first test signal.

14. The method recited in claim 1, wherein said first test signal is a low current, high frequency signal.

15. The method recited in claim 1, wherein at least one of said approximate location and said location within said approximate location is a two-dimensional location relative to the top surface of the package.

16. The method recited in claim 1, wherein said short between planes is a short between voltage planes of the package, and wherein said I/O-to-plane short is an I/O-to-voltage plane short of the package.

17. The method recited in claim 1, wherein said step of detecting a short in the top surface of the package includes simultaneously testing a plurality of I/O nets to power to detect the short.

18. An apparatus for locating shorts in multi-layer electronic packages during manufacture comprising:

a fixture for receiving a multi-layer package after a thin film layer of metalization had been formed on a top surface of the package;

a set of pins on a bottom surface of the package;

a reference signal generating circuit which applies a first test signal to said set of pins; and a sensor movable in a plane parallel to the top surface of the package for detecting a magnetic field produced by a short on the top surface when said first test signal is applied to said set of pins, the short being at least one of a short between planes of the package and an I/O-to-plane short of the package;

wherein a location of said magnetic field relative to the top surface corresponds to an approximate two-dimensional location of the short.

19. An apparatus as recited in claim 18 wherein the sensor comprises an iron core inductor generating an output signal indicative of a strength of said magnetic field, and wherein said apparatus further comprises a first detecting circuit for receiving the output signal and providing a first output indicative of the approximate location of the short.

20. The apparatus recited in claim 19 further comprising a visual indicator responsive to the output of the detecting circuit.

21. An apparatus as recited in claim 19 further comprising:

a voltage controlled oscillator responsive to the output of the detecting circuit; and a speaker responsive to an output of the voltage controlled oscillator for generating an audible indication of the detected signal strength.

22. An apparatus as recited in claim 19 further comprising:

a second reference signal generating means for injecting a second test signal in at least one of said pins, said second signal having a different frequency from the first test signal;

a second detecting circuit for receiving the output sisal from the sensor and providing a second output indicative of the approximate location of the short; and a circuit for combining the outputs from the first and second detection circuits to provide an indication of the approximate location of the short.

23. An apparatus as recited in claim 19, wherein said approximate location corresponds to a location on the top surface where said output signal corresponds to a maximum strength of said magnetic field.

24. An apparatus recited in claim 19 further comprising:

a stage supporting said fixture, said stage being movable in two dimensions in a plane parallel to the top surface of the multi-layer package;

an analog-to-digital converter for converting an output of the first detecting circuit to a digital signal; and a computer connected to receive said digital signal and programmed to control said stage to maximize the signal output of the first detecting circuit.

25. An apparatus as recited in claim 24 wherein the iron core inductor is mounted in relation to a microscope having an objective lens proximate to the top surface of the multi-layer package, said microscope being used to determine a location of the short within said approximate location.

26. An apparatus as recited in claim 24 wherein said stage is movable in three perpendicular axes, the stage being controlled by the computer to maximize the output from the first detecting circuit in a plane parallel to the top surface of the multi-layer package and to move said stage in a direction perpendicular to said plane to provide an indication of a depth of the short within said multi-layer package.

27. An apparatus as recited in claim 26, wherein said computer moves said stage to a location where said sensor detects a maximum strength of said magnetic field, and wherein said location where said sensor detects the maximum strength of said magnetic field corresponds to said approximate location.

28. An apparatus as recited in claim 18 wherein the sensor comprises a predetermined number of iron core inductors which are differentially wound, said iron core inductors generating an output signal similar to a correlation detection signal, and wherein said apparatus further comprises a detecting circuit for receiving the output signal and providing an output indicative of the approximate location of the short.

29. An apparatus as recited in claim 28, wherein said predetermined number is an even number.

30. An apparatus as recited in claim 18, wherein said sensor is moved over the top surface to detect said magnetic field as a back electromotive force induced in a coil of the probe which is 90° out of phase with said first test signal.

31. An apparatus as recited in claim 18, wherein said short between plane between voltage planes of the package, and wherein said I/O-to-plane short is an I/O-to-voltage plane short of the package.

* * * * *